US008243259B2

(12) United States Patent
Prosyentsov et al.

(10) Patent No.: US 8,243,259 B2
(45) Date of Patent: Aug. 14, 2012

(54) LITHOGRAPHIC APPARATUS

(75) Inventors: Vitally Prosyentsov, Deurne (NL);
Sanjaysingh Lalbahadoersing,
Helmond (NL); Sami Musa, Veldhoven
(NL); Hyun-Woo Lee, Veldhoven (NL)

(73) Assignee: ASML Netherlands B.V., Veldhoven
(NL)

( * ) Notice: Subject to any disclaimer, the term of this patent is extended or adjusted under 35 U.S.C. 154(b) by 565 days.

(21) Appl. No.: 12/486,458

(22) Filed: Jun. 17, 2009

(65) Prior Publication Data

US 2009/0316122 A1    Dec. 24, 2009

Related U.S. Application Data

(60) Provisional application No. 61/129,315, filed on Jun. 18, 2008, provisional application No. 61/102,467, filed on Oct. 3, 2008.

(51) Int. Cl.
*G01B 11/00*    (2006.01)
*G03B 27/42*    (2006.01)
*G03B 27/54*    (2006.01)
*G03B 27/58*    (2006.01)
*G03B 27/74*    (2006.01)

(52) U.S. Cl. ............... 355/68; 355/53; 355/67; 355/72; 356/400; 356/401

(58) Field of Classification Search ............... 250/492.2, 250/559.3; 310/12.05–12.06; 355/30, 53, 355/55, 67–68, 72, 75; 356/399–401, 614–624
See application file for complete search history.

(56) References Cited

U.S. PATENT DOCUMENTS

| 4,509,852 | A | 4/1985 | Tabarelli et al. |
| 6,297,876 | B1 | 10/2001 | Bornebroek |
| 2002/0067473 | A1* | 6/2002 | Deguchi et al. ............... 355/53 |
| 2006/0187432 | A1* | 8/2006 | Yasuda et al. ............... 355/53 |
| 2010/0321695 | A1* | 12/2010 | Van Buel et al. ............... 356/432 |

FOREIGN PATENT DOCUMENTS

| JP | 58007823 A * | 1/1983 |
| JP | 04-037113 | 2/1992 |
| JP | 2002-008962 | 1/2002 |
| JP | 2002-140005 | 5/2002 |
| JP | 2005-268747 | 9/2005 |
| JP | 2007-103658 | 4/2007 |
| JP | 2007-281463 | 10/2007 |

OTHER PUBLICATIONS

Japanese Office Action dated Feb. 7, 2012 in corresponding Japanese Patent Application No. 2009-140853.

* cited by examiner

*Primary Examiner* — Hung Henry Nguyen
*Assistant Examiner* — Colin Kreutzer
(74) *Attorney, Agent, or Firm* — Pillsbury Winthrop Shaw Pittman LLP

(57) ABSTRACT

A substrate stage for an immersion type lithographic apparatus is arranged to project a patterned radiation beam from a patterning device onto a substrate, the substrate stage being constructed to hold the substrate and including at least a sensor for sensing the patterned radiation beam, the sensor including an at least partially transmissive layer having a front side facing the incoming radiation beam and a back side opposite the front side, wherein the back side is provided with at least a sensor mark to be subjected to the radiation beam transmitted through the layer.

15 Claims, 7 Drawing Sheets

(Prior Art)

(Prior Art)

(Prior Art)

LITHOGRAPHIC APPARATUS

CROSS REFERENCE TO RELATED APPLICATIONS

This application claims priority and benefit under 35 U.S.C. §119(e) to U.S. Provisional Patent Application No. 61/129,315, entitled "Lithographic Apparatus", filed on Jun. 18, 2008, and U.S. Provisional Patent Application No. 61/102,467, entitled "Lithographic Apparatus", filed on Oct. 3, 2008. The contents of those applications are incorporated herein in their entirety by reference.

FIELD

The present invention relates to an immersion type lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to accurately apply a desired pattern onto a target portion of a substrate, the reticle should be aligned with respect to the substrate. Therefore, according to the prior art, the relative position of the reticle with respect to the substrate is set accurately, by measuring and adjusting the relative position. Alignment of the patterning device with respect to the substrate may, according to the state of the art, be done using two alignment actions.

In the first action the substrate is aligned with respect to the substrate stage carrying the substrate, while in the second action the reticle is aligned with respect to the substrate stage. As a result of these two actions, the reticle is aligned with respect to the substrate, as desired.

In case a single stage machine is used, the first and second action are carried out at the exposure position. In case a dual stage machine is used, the first action may be carried out at a first position, remote from the exposure position. Then, the substrate stage with the substrate positioned on it is transported to the second position, i.e. the exposure position, where the second action is performed.

The first action may be carried out with two sensor assemblies. A first sensor assembly comprises an alignment sensor and measures the relative position of the substrate with respect to the substrate stage in X, Y and Rz directions, where the XY plane is defined as the plane that is substantially parallel with the surface of the substrate, the X- and Y-direction being substantially perpendicular with respect to each other. The Z-direction is substantially perpendicular with respect to the X- and Y-directions, so Rz represents a rotation in the XY plane, about the Z-direction. A more detailed description about this sensor is for instance provided in U.S. Pat. No. 6,297,876. A second sensor assembly, usually referred to as the level sensor, measures the height of the substrate surface in dependence on locations on the substrate to be exposed, creating a height map based on the determined heights, and also determines the rotations about the X and Y axes: Rx, Ry.

Next, in the second action, the reticle is aligned with respect to the substrate stage. This may be done with an image sensor, such as a transmission image sensor, as will be known to a person skilled in the art. A transmission image sensor measurement is performed by imaging a first alignment pattern (mask alignment mark) provided on the reticle or on the reticle stage carrying the reticle, through the projection system (lens) onto one or more plates (i.e. the transmission image sensor plate) provided at or in the substrate stage. The transmission image sensor plate comprises a second alignment pattern. The alignment patterns may include a number of isolated lines. Inside the substrate stage, behind the second alignment pattern in the transmission image sensor plate, a light sensitive detector is provided, e.g. a diode, that measures the light intensity of the imaged first alignment pattern. When the projected image (i.e. the aerial image) of the first alignment pattern exactly matches the second alignment pattern, the sensor measures a maximum intensity. The substrate stage is now moved in the X- and Y-directions on different Z-levels, while the sensor measures the intensity. Therefore, the transmission image sensor is actually an aerial image sensor, in which multiple scanning slits probe the aerial image of isolated lines. Based on these measurements, an optimal relative position of the substrate stage can be determined. Below a typical transmission image sensor will be explained in more detail.

As mentioned above, in the first action, the alignment sensor measures the position of the substrate with respect to the substrate stage carrying the substrate. The alignment sensor also measures the XY position of the transmission image sensor plate, more specifically the position of a fiducial mark on the transmission image sensor plate, while the level sensor, in combination with a further sensor (Z-interferometer), measures the Z-position thereof. Based on the position of the substrate with respect to the substrate stage and the position of the transmission image sensor with respect to the substrate stage, the position of the substrate relative to the transmission image sensor can be determined.

As mentioned above as well, in the second action the reticle is aligned with respect to the substrate stage. The position of the aerial image may be measured by the transmission image sensor and this gives the position of the aerial image with respect to the transmission image sensor. The information from both actions may be combined to calculate the optimal position of the substrate stage (and possibly to determine the lens corrections as well) for the best match of the aerial image and the substrate.

Furthermore it has been proposed to immerse the substrate in the lithographic apparatus in a liquid having a relatively high refractive index, e.g. water, so as to fill a space between the final element of the projection system and the substrate. This enables imaging of smaller features since the exposure radiation will have a shorter wavelength in the liquid relative to the wavelength in air. The effect of the liquid may also be regarded as increasing the effective numerical aperture NA of the system and also increasing the depth of focus.

One of the known drawbacks of the immersion type lithographic apparatus is the presence of liquid, for instance water, usually in the form of droplets, at the surface of the substrate and the surrounding structure, for instance at the mirror block and at the sensors (for instance the transmission image sensor) provided in the mirror block. More specifically, the liquid may be present on the upper surface of the transmission image sensor plate, which typically is made of quartz material. More specifically, most of the surface of the transmission image sensor plate is coated by Cr and TiN on top of Cr. Cr and TiN are hydrophilic materials. Consequently, the liquid will take the form of a large number of liquid droplets on the plate. The presence of the liquid on top of the transmission image sensor plate appears to be unavoidable, especially for high throughputs, i.e. for high-speed immersion type lithographic apparatus. While a large portion of the liquid droplets evaporate relatively fast (for instance in about 15-25 seconds), they can have a significant (and negative) influence on the substrate production process as a whole. A liquid drop may, for instance, act as a lens for the alignment and level sensors, thereby disturbing their proper functioning and possibly decreasing their accuracy. Furthermore, the drying liquid may locally reduce the temperature of the sensor(s). As a result distances between marks and their height change due to the thermal expansion and increased tensions in the sensor structure, thereby disturbing the measurement process.

To avoid these disadvantages the sensor surface may be covered with a water repellent coating. However, this may prove problematic because the aerial image can be mapped incorrectly due to its location in two media with different refractive indices. Furthermore there are complexities of modeling of an aerial image located in two (or more) different media. This is important for the fit algorithm's used in practice. Furthermore, if the coating is relatively thin, it can be easily destroyed by radiation, for instance UV radiation, and/or corrupted by hard dust particles. Another disadvantage is that it will repeat the shape of the underlying grating, giving the coating a "rough" upper surface.

More specifically, marks provided at the front sensor surface may have topography even after deposition of thick layer of hydrophobic coating. The topography is caused by the large grooves of the alignment marks. The topography can be a source of contamination. It can easily trap the water droplets or particles like resist flakes in the water. Furthermore, cleaning the sensor surface may be difficult due to the presence of the grooves. One may try to reduce the topography by sub-segmentation of the alignment marks with a view to planarize the marks. However, sub-segmentation requires higher manufacturing cost of the sensor and might lead to loss of alignment signal.

SUMMARY

It is desirable to provide an improved lithographic apparatus wherein at least one of the disadvantages of the prior art has been removed or alleviated.

According to an aspect of the invention, there is provided an immersion type lithographic apparatus arranged to project a patterned radiation beam from a patterning device onto a substrate, the substrate stage being constructed to hold the substrate and comprising at least a sensor for sensing the patterned radiation beam, the sensor comprising an at least partially transmissive layer having a front side facing the incoming radiation beam and a back side opposite the front side, wherein the back side is provided with at least a sensor mark to be subjected to the radiation beam transmitted through the layer.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
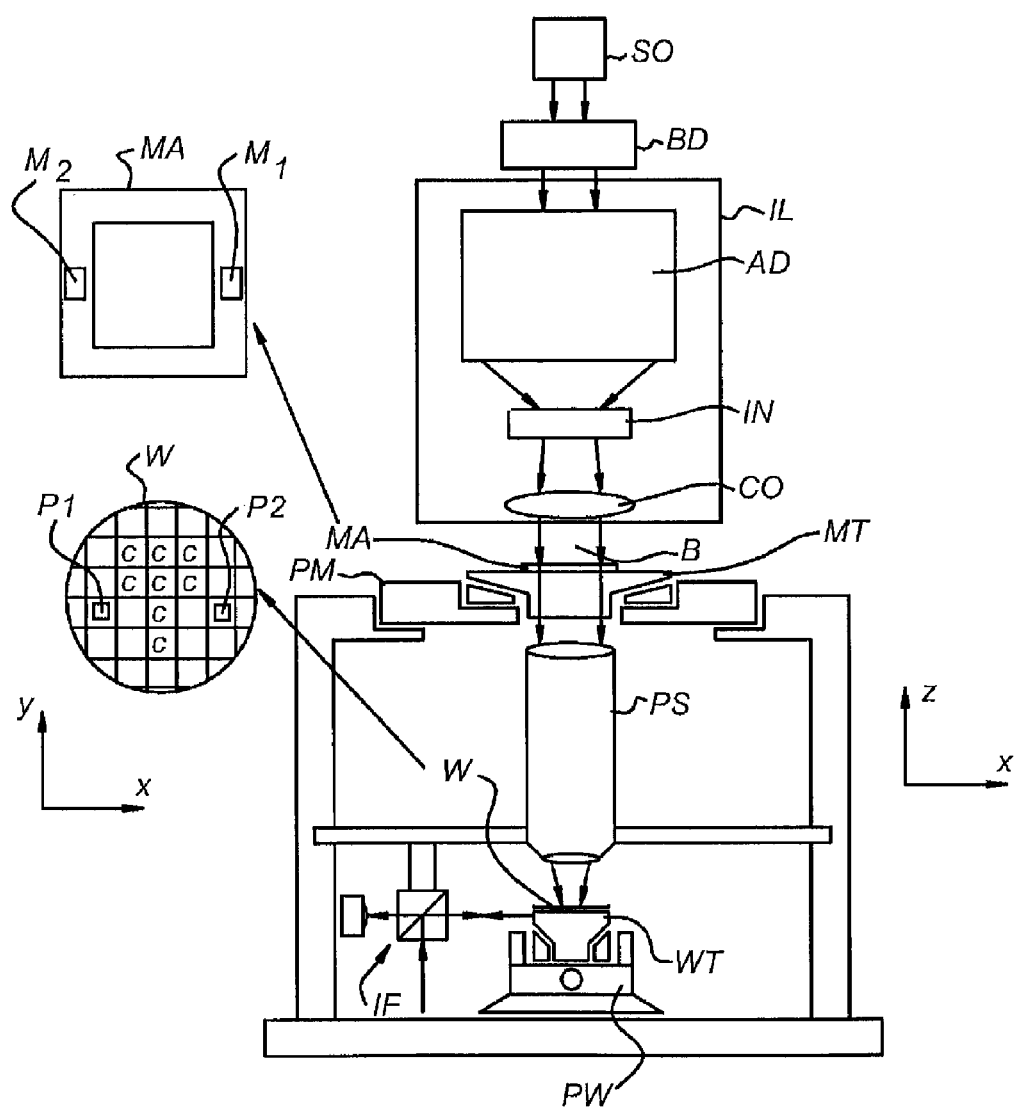
FIG. 1 depicts a lithographic apparatus according to the prior art.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate stage 9 comprising a mirror block including a substrate table (e.g. a wafer table) WT constructed to hold a substrate (e.g. a resist-coated wafer) W, the mirror block being connected to a second positioner PW configured to accurately position the substrate in accordance with certain parameters; and a projection system (e.g. a refractive projection lens system) PL configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g. an interferometric device, linear encoder or capacitive sensor), the mirror block and the substrate table WT clamped thereto can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate stage 9 may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
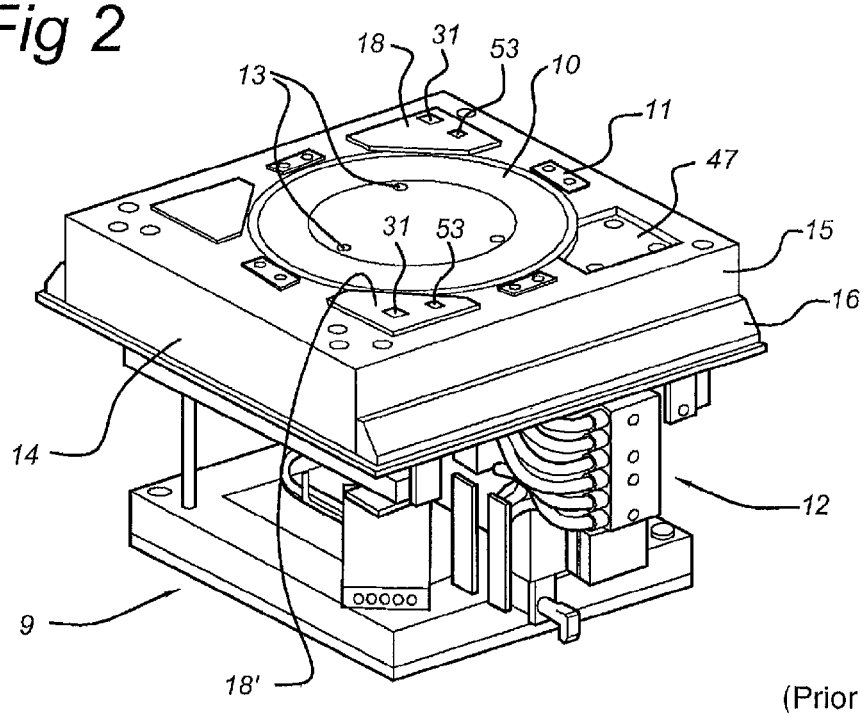
FIG. 2 a side view in perspective of a prior art substrate stage chuck.
Figure 3:
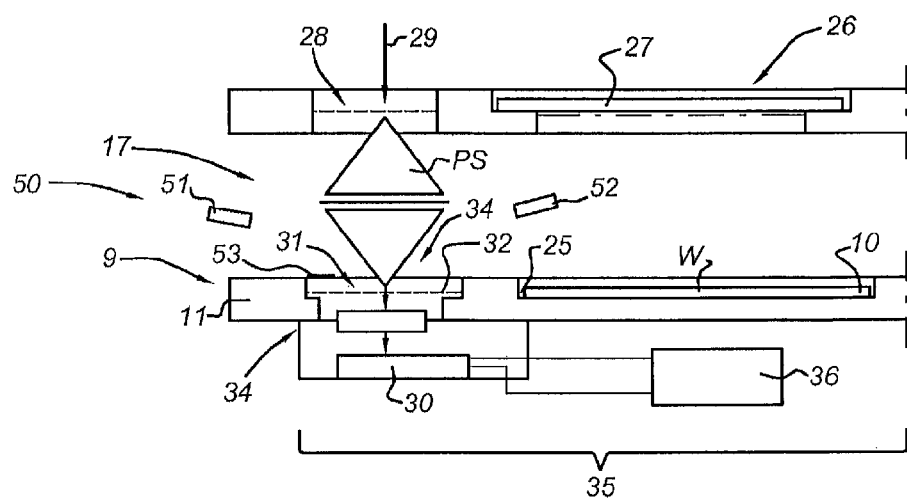
FIG. 3 a cross-section of a part of the reticle stage and the substrate stage chuck depicted in FIG. 2.

FIGS. 2 and 3 show an example of an existing substrate stage 9 in more detail. The substrate stage 9 comprises a substrate table 10, a mirror block 11, a substrate stage carrier module 12 and a number of positioning motors for positioning the mirror block 11 (and the substrate table 10 attached to it) relative to the substrate stage carrier module 12.

The substrate table 10 is configured to clamp a substrate (not shown in FIG. 2) through means of vacuum. Furthermore, the substrate table 10 has three movable pins guided in holes 13 (FIG. 2). The pins are used to load or unload the substrate (W) onto or from the substrate table 10. To this end the pins may be raised above the substrate table 10 to accept or release the substrate. The substrate table 10 is placed on top of the upper surface of the mirror block 11, more specifically on the upper surface of a recess 25 (cf. FIG. 3) formed in the mirror block 11. In an embodiment of the invention the mirror block 11 and the substrate table 10 are separate elements, one clamped on top of the other, for instance by means of vacuum.

The mirror block 11 not only supports the substrate table 10, but is also part of the interferometer position measurement system. The mirrors of the mirror block, for instance mirror planes 14-16, reflect the interferometer laser beams to the interferometers (IF). The mirror block 11 is in turn supported by the substrate stage carrier module 12 through means of the earlier-mentioned positioning motors.

Several sensors are used at substrate level for evaluating and optimizing imaging performance. These sensors may include the earlier-mentioned transmission image sensors, spot sensors for measuring exposure radiation dose and integrated lens interferometers at scanner (ILIAS) sensors. An example of a transmission image sensor is described below in more detail.

Transmission Image Sensor

The lithographic apparatus may be equipped with a transmission image sensor module 17 including one or more transmission image sensors 18,18' located at the substrate level. Typically the lithographic apparatus is provided with two transmission image sensors 18,18', located at two opposite corners of the substrate table 10. As mentioned earlier, the transmission image sensors 18,18' are used for aligning reticle stage 26 and substrate stage 9 relative to each other and for measuring the quality of the projected image.

Referring to FIG. 3, the reticle 27 (i.e. mask MA in FIG. 1) or the reticle stage 26 comprises one or more reticle gratings or reticle marks 28 (cf M1,M2 in FIG. 1). An image of the reticle mark 28 is formed by the projection system PS onto a plate 32 of the transmission image sensor 18,18', the image formed by projecting a radiation beam 29 (i.e. beam B in FIG. 1) through the projection system. The plate 32 of the sensor 18,18' is level with the upper surface of the mirror block and comprises a grating structure 31 with transmissive and reflective (or absorbing) elements (for instance a transmissive pattern in a layer of chromium). When the image is in focus at, and aligned with the grating structure 31 of the transmission image sensor plate 32, the transmissive elements correspond to the image. A detector 30 (such as a photodiode) is positioned behind the grating structure 31, inside a recess in the mirror block. The detector 30 is arranged and constructed to measure the intensity of the radiation behind the grating structure.

If the image is in focus at, and aligned with the structure, all radiation passes through the structure, resulting in a maximal intensity at the detector. If the image is not in focus at the grating structure 31 or is misaligned with the structure, part of the radiation falls onto the reflective (or absorbing) elements and the intensity measured by the detector 30 behind the structure will be lower.

At several relative positions between the reticle and the substrate stage intensities of radiation that has passed the reticle mark 28 and the grating 31 are measured by the detector 30 to find the position where the measured intensity has a maximal. This relative position corresponds with the reticle mark being in focus at and aligned with the structure of the transmission image sensor 18,18'.

Alignment Sensor

Additionally or alternatively the lithographic apparatus may be provided with a reflection image sensor module 50 including one or more reflection image sensors 51,52 (herein also referred to as alignment sensors and shown schematically in FIGS. 2 and 3). The alignment sensors 51,52 measure a position of one or more alignment marks, provided on the substrate and/or a fiducial, for instance an alignment mark 53 on the transmission image sensor plate 32 of the sensors 18,18' that are attached on the mirror block of the substrate stage. During alignment an alignment mark 53 is illuminated with an alignment beam of radiation. The alignment beam of radiation is diffracted by the alignment mark 53 into several diffraction orders such as +1,−1,+2 and −2. Using optical elements of the sensor 51,52, each set of corresponding diffraction orders (say +1 and −1) is used to form an image of the alignment mark onto a reference plate. The reference plate comprises reference gratings for each set of corresponding diffraction orders to be measured. Behind each reference grating a separate detector is arranged to measure the intensity of the radiation in the image passing through the reference gratings. By moving the alignment mark relative to the reference plate, the position with the highest intensity for one or more images is found, which gives the aligned position. To enhance performance, the intensity of several images can be measured and the alignment beam of radiation can consist of multiple colours (for instance red laser light ($\lambda$=633 nm) and green laser light ($\lambda$=532 nm)).

Immersion Type Lithographic Apparatus

As mentioned above, the lithographic apparatus may be of a type wherein at least a portion of the substrate is covered by a liquid having a relatively high refractive index, e.g. water, so as to fill a space between the projection system and the substrate. An example of an immersion type lithographic apparatus is disclosed in U.S. Pat. No. 4,509,852, hereby incorporated in its entirety by reference. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Figure 4:
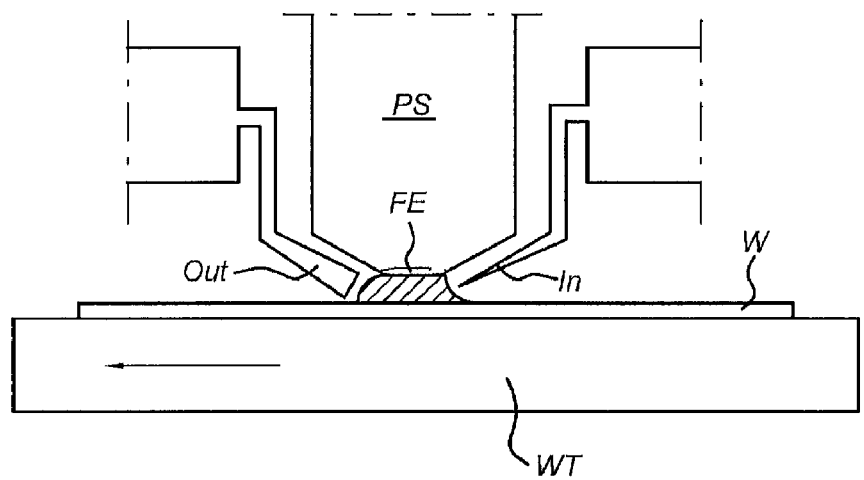
FIGS. 4 and 5 depict two embodiments of a liquid supply system used in a prior art lithographic projection apparatus.

Different solutions are known to provide a lithographic apparatus with immersion liquid. A known system for providing a liquid is a system wherein liquid is present only on a localized area of the substrate W and in between a final element FE of the projection system PS and the substrate W using a liquid confinement system (the substrate W generally has a larger surface area than the final element of the projection system PS). One known arrangement for applying this immersion technique to a lithographic apparatus is illustrated in FIG. 4, in which liquid is supplied by at least one inlet IN onto the substrate W, preferably along the direction of movement of the substrate W relative to the final element FE of the projection system PS. The liquid is removed by at least one outlet OUT after having passed under the projection system PL. That is, as the substrate W is scanned beneath the element in a −X direction, liquid is supplied at the +X side of the element and taken up at the −X side.

Figure 5:
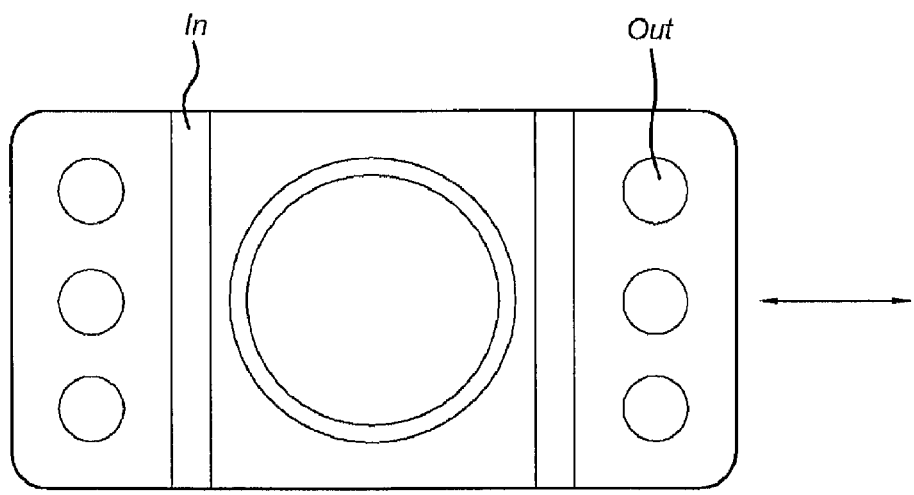

Another solution which has been proposed is to provide the liquid supply system with a seal member which extends along at least a part of a boundary of the space between the final element of the projection system and the substrate table. Such a solution is illustrated in FIG. 5. The seal member is substantially stationary relative to the projection system in the XY plane though there may be some relative movement in the Z direction (in the direction of the optical axis). A seal is formed between the seal member and the surface of the substrate. Preferably the seal is a contactless seal such as a gas seal, but a mechanical seal may be applied as well.

In an immersion type lithographic apparatus it has proven to be almost inevitable that, in spite of the seal, (eventually) drops of liquid will be present on the surface of the transmission image sensor plate 28 of the transmission image sensor 18,18'. The presence of liquid at this location may reduce the accuracy of the measurements to be performed by the transmission image sensor. Another disadvantage is that the immersion liquid may contain contamination, for instance due to multiple working cycles and cross contamination, and in addition to this the liquid may transmit dust particles from one place of the mirror block to another. Beside, any drying liquid droplet present on top of a sensor area of the mirror block may leave dust particles on the mirror block surface, more specifically on the sensor area (for instance at the transmission image sensor plate surface, more specifically on the transmission image sensor marks or gratings as well), effectively "recycling" the contamination and decreasing the accuracy of the transmission image sensor and advanced alignment (AA) measurements.

The number of droplets can be significantly decreased when all surfaces contacting with the liquid are be covered with a coating designed to repel the immersion liquid, for instance a hydrophobic coating in case the immersion liquid is water. This is elucidated in FIG. 6.

Figure 6:
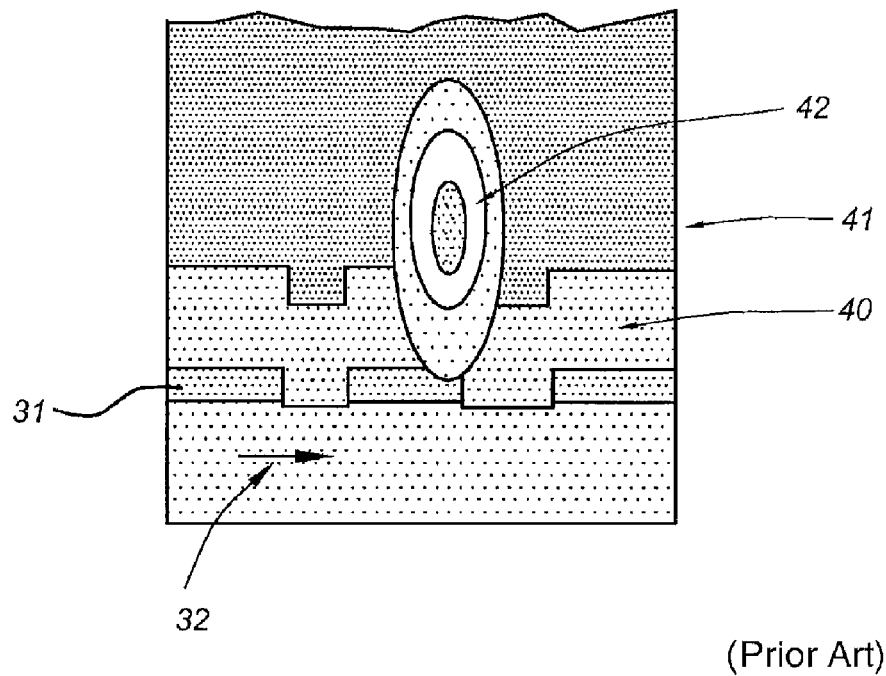
FIG. 6 is a schematic cross-section of an example of a transmission image sensor provided with a surface layer for repelling the immersion liquid.

Referring to the example of FIG. 6, a part of one of the transmission image sensors 18 is shown. The transmission image sensor plate 32 (including the transmission image sensor mark or grating 31) is covered with an hydrophobic polymer layer or coating 40. An example of a suitable polymer coating is a coating containing silicon. This coating may be applied both on the mirror block upper surface and on the transmission image sensor surface, more specifically on the transmission image sensor plate 32 and the transmission image sensor grating 31 provided on the plate. The coating typically has a refraction index of about 1,4-1,5 for wavelength between 200 and 1000 nm and a thickness between about 200 nm and 1000 nm, preferably between about 300-500 nm.

A transmission image sensor plate 32 is typically made of quartz (having a refraction index of about 1,56, for a wavelength of 193 nm), while the grating 31 is made of a thin (about 100 nm) Chromium (Cr) layer, the Cr layer having periodically positioned windows (gratings). Quartz as such is a hydrophilic material. By covering the hydrophilic material by a hydrophobic coating 40, the material that is exposed to the immersion liquid 41 is hydrophobic.

However, as mentioned previously, covering the transmission image sensor plate 32 and the gratings 31 provided thereon with a coating 40 (cf. FIG. 6) may prove risky because the aerial image 42 of the transmission image sensor mark 28 in the reticle (stage) can be mapped incorrectly on the sensor due to its location in two media (i.e. the immersion liquid 41 and the hydrophobic coating 40), both media having different refractive indices. Moreover, it is rather complex to model an aerial image located in two (or more) different media. The modeling is usually performed in order to find a suitable fitting algorithms to be able to properly align the substrate. This additional complexity is inconvenient. Since the number of fit algorithms to be used when illumination conditions change from conventional illumination to exotic modes is enormous, the necessity to develop even more fitting algorithms should be avoided.

Covering a transmission image sensor plate by a thin coating may have other disadvantages as well. The relatively thin coating may be destroyed by UV radiation, corrupted by hard dust particles, and/or will repeat the shape of the grating 31 (i.e. it will be rough). On the other hand, applying a thick coating on the transmission image sensor plate and its grating may also be problematic due to the high UV absorption in the coating and due to the high aberrations caused by such coating.

Figure 7:
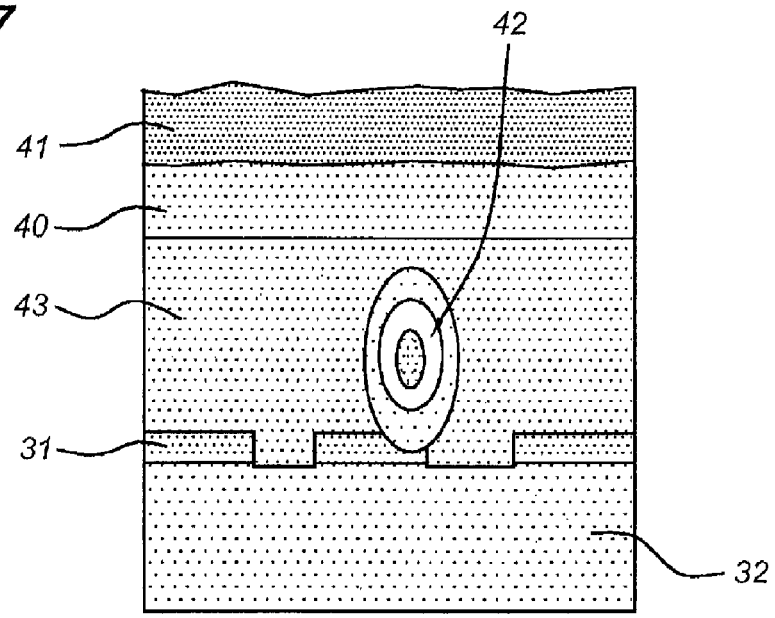
FIG. 7 is a schematic cross-section of an embodiment of a transmission image sensor provided with both an outer (surface) layer and an intermediate layer according to an embodiment of the present invention.

Referring to FIG. 7 wherein an embodiment of the present invention is shown, an transmissive layer 43 of sufficient thickness is provided between the transmission image sensor plate 32 and the hydrophobic coating 40. The thickness of the transmissive layer or coating 43 is such, that the essentially the entire aerial image of the projected pattern is accommodated inside the coating 43. In embodiments of the invention the thickness of the layer 43 is larger than the size of the aerial image in the depth dimension so that the layer does not substantially affect the dimensional properties of the aerial image to be measured. Furthermore, the presence of the layer 43 between the sensor surface and the further repellent layer provides protection for the sensor, even if the repellent layer is damaged or even completely destroyed, for instance by UV radiation and/or scratches.

In a specific embodiment the transmissive layer 43 is made of glassy material and is essentially non-absorptive for the radiation used to project the aerial image on the sensor.

The refractive index of the material of the transmissive layer may be substantially the same as the index of the immersion liquid. In case of water the refraction index of the immersion fluid is n=1,43 (for a wavelength of about 193 nm). In an embodiment the refractive index of the material of the transmissive layer is in the range of about 1,40-1,45. However, the refraction index may take different values as well, for instance in the range from 1,45 to about 1,54.

The hydrophobic layer 40 causes water droplets present on the layer to exhibit a high contact angle, leaving only relatively small droplets on top of the sensor surface. The relatively small droplets evaporate relatively fast. Furthermore the hydrophobic coating 43 decreases the number of water droplets. Therefore reduces the risk of water droplets acting as a lens thereby jeopardizing the correct outcome of the measurements.

The presence of the transmissive layer has a number of additional advantages. Due to its thickness (typically between 1 and 5 μm, preferably between 1 and 3 μm) the transmissive layer 43 may be dimensioned to completely include the aerial image (preferably in all three directions X,Y and Z, but at least in the depth (Z) direction) without essentially affecting its properties, in particular its geometrical dimensions. Thus, the accuracy of the transmission image sensor measurements may be preserved. Furthermore, the transmissive layer provides a relatively flat substrate on top of which a further coating, for instance the hydrophobic coating 40 discussed earlier, may be applied and this flat surface may have a positive effect on the results of advanced alignment (AA) measurements. Furthermore the transmissive layer provides additional protection of the transmission image sensor grating 31 against contamination, even if the hydrophobic coating 40 is destroyed, for instance by UV radiation and/or scratching. Finally, the frequency of maintenance operations, for instance replacement of the transmission image sensor plate of the sensor, due to contamination damage, may be considerably reduced, thereby increasing the operational efficiency of the lithographic apparatus.

In the embodiment shown in FIG. 7 the transmissive layer 43 has been provided on top of the transmission image sensor plate 32 and the grating 31 of the transmission image sensor is provided between the plate 32 and the transmissive layer 43. In other embodiments, for instance the embodiments shown in FIGS. 8-18, the plate 32 may be dispensed with and the grating is provided at the back surface of the transmissive layer 43 or, in other words, the transmissive layer 43 may be formed by the transmission image sensor plate 32 of a transmission image sensor, as will be explained hereafter.

Figure 8:
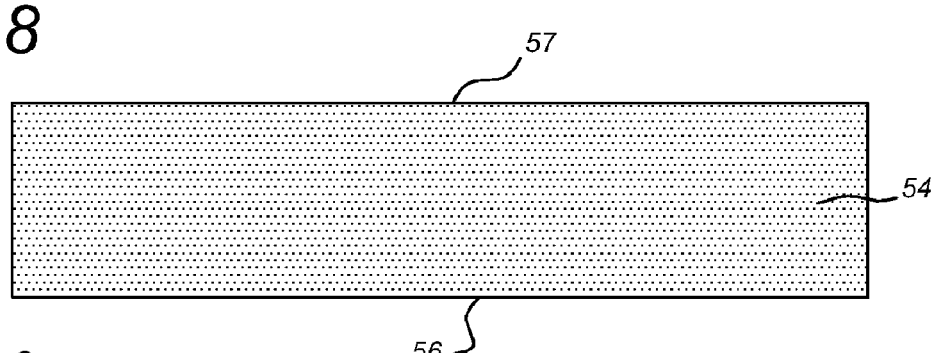
FIGS. 8-11 show cross-sections of another embodiment of substrate stage having a transmission image sensor and a reflection image sensor, depicted in respective stages of the manufacturing process.
Figure 9:
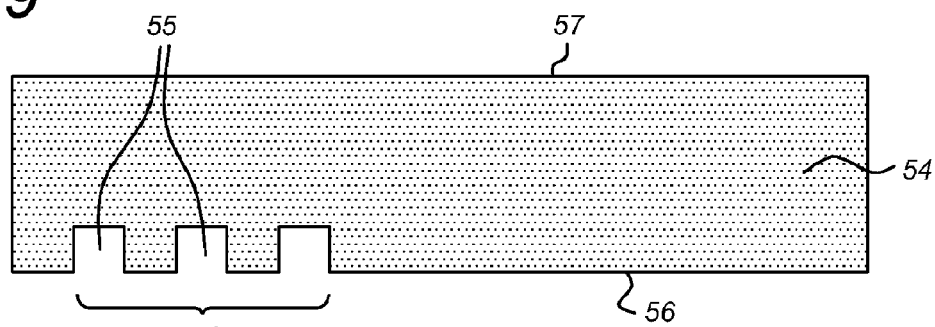

FIG. 8 shows an embodiment having a transmissive substrate or layer 54, for instance formed by the transmission image sensor plate 32 mentioned above. The transmissive layer 54 is essentially transmissive and is preferably made of a suitable quartz material (glass). Alignment marks 53 are arranged directly in the transmissive layer 54, for instance by suitably etching away portions 55 of the transmissive layer material. Referring to FIG. 9, the alignment marks 53 are arranged at the back surface 56 of the transmissive layer 54, i.e. the surface opposite the front surface 57 facing the incoming radiation beam, for instance laser beam 29 (cf. FIG. 1).

Figure 10:
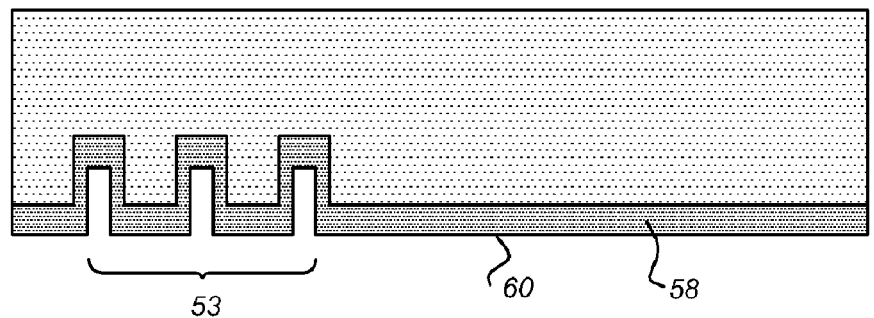

Next an essentially non-transmissive layer 58, for instance a Cr-layer, is deposited at the back surface 56 of the transmissive layer 54. As is shown in FIG. 10, the non-transmissive layer 58 covers the etched and non-etched areas of the transmissive layer 54. The non-transmissive layer 58 therefore also covers the portions 55 arranged previously in the transmissive layer 54. The portions 55 covered with the non-transmissive material of the non-transmissive layer 54 thus form the refraction image sensor marks (alignment marks) 53.

Figure 11:
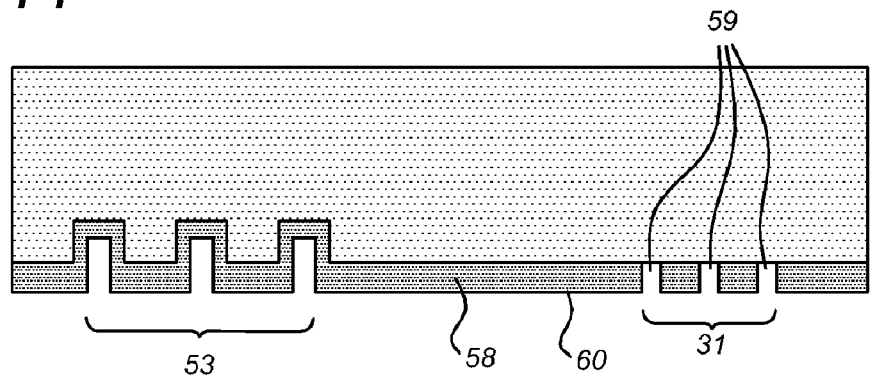

Referring to FIG. 11, in a next processing step, one or more transmission image sensor marks or gratings 31 may be arranged in the non-transmissive layer 58, for instance by partly etching away portions 59 of the back part (at the back surface 60) of the non-transmissive layer 58. In the embodiment shown in FIG. 11, the transmissive layer 54 is provided with both a reflection image sensor mark (alignment mark) 53 and an transmission image sensor mark 31. In other embodiments the transmissive layer 54 may be provided with either at least one reflection image sensor mark 53 or at least one transmission image sensor marks 31.

Figure 12:
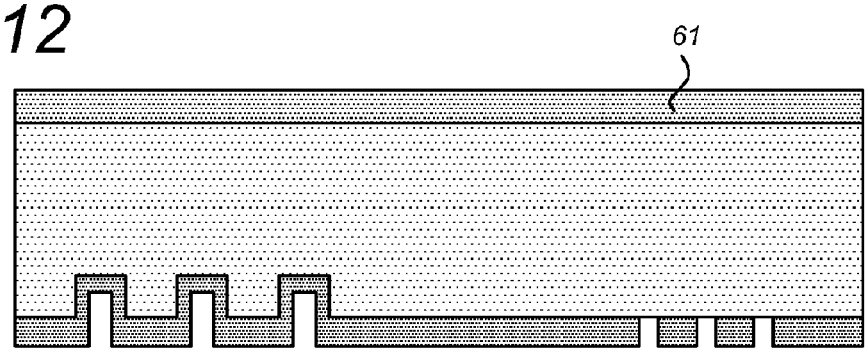
FIG. 12 shows a cross-section of another embodiment of the substrate stage.

In another embodiment shown in FIG. 12, the transmissive layer 54 is at least partly covered by a protective layer, for instance a hydrophobic coating 61 of the type discussed earlier. The coating 61 reduces the risk of water droplets acting as a lens thereby jeopardizing the correct outcome of the measurements. Furthermore, the flat surface of the transmissive layer 54 and, in the present embodiment, the flat surface of the coating 61 leaves the sensor without any substantial topography and facilititates the cleaning operation of the sensor.

Figure 13:
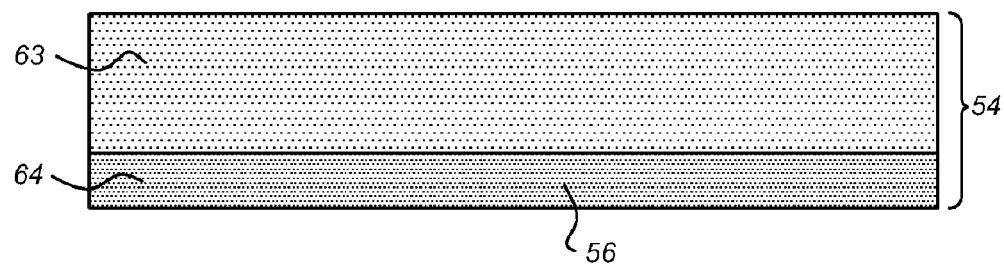
FIGS. 13-16 show cross-sections of another embodiment of a substrate stage having a transmission image sensor and a reflection image sensor, depicted in respective stages of the manufacturing process.

FIGS. 13-17 represent other embodiments of the present invention. FIG. 13 shows that the transmissive plate or layer 54 comprises an upper layer 63 and a lower layer 64. The upper layer 63 may be formed the transmission image sensor plate 32 mentioned above and may be made of a suitable quartz material (glass). The lower layer 64 is made of transmissive material as well, for instance $Si_3N_4$. The Si3N4 layer is provided for etching selectivity in order to have alignment marks with well defined grating depth.

Figure 14:
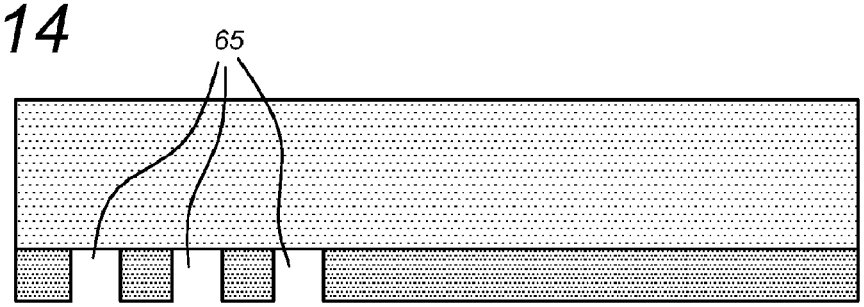

Referring to FIG. 14, the material of the lower layer 64 is partly removed (cf removed portions 65), for instance by an etching operation. The removed portion(s) 65 are part of the reflection image sensor marks to be provided at the back surface of the transmissive layer 54. Also one or more transmission image sensor marks 31 may be provided at the back side of the transmissive layer 54, as is described hereafter.

Figure 15:
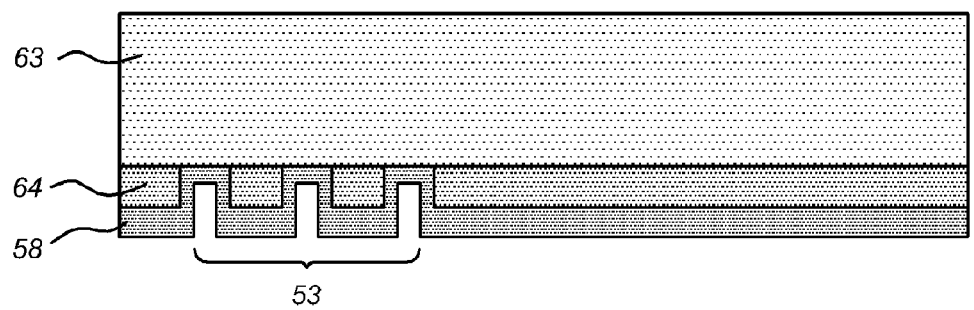

Referring to FIG. 15, an essentially non-transmissive layer 58, for instance a Cr layer, is deposited at the back surface 56 of the transmissive layer 54, i.e. the back surface of the lower layer 64 of the transmissive layer 54. As is shown in FIG. 15, the non-transmissive layer 58 covers the etched and non-etched areas of the transmissive layer 54, thereby forming the reflection image sensor marks 53.

Figure 16:
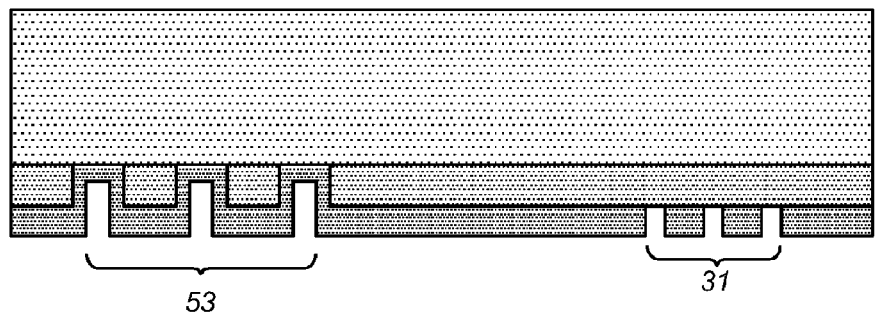

Referring to FIG. 16 and similarly to the embodiment shown in FIG. 11, in a next processing step, one or more transmission image sensor marks or gratings 31 may be arranged in the non-transmissive layer 58 by removing portions of the non-transmissive layer 58, for instance by partly etching the back surface 60 thereof In the embodiment of FIG. 16, the transmissive layer 54 is provided with both a reflection image sensor mark (alignment mark) 53 and an transmission image sensor mark 31. In other embodiments the transmissive layer 54 may be provided with either at least one reflection image sensor mark 53 or at least one transmission image sensor marks 31.

Figure 17:
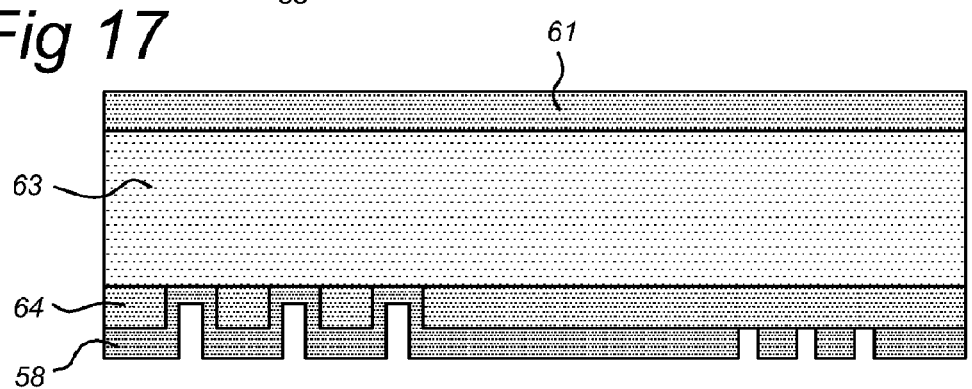
FIG. 17 shows a cross-section of another embodiment of the substrate stage.

In a further embodiment represented in FIG. 17, the upper layer 63 of the transmissive layer 54 is at least partly covered by a protective layer. The upper surface of the protective layer may have an essentially flat surface so that the sensor may be cleaned easily and the risk of contamination may be reduced. In an embodiment of the present invention the protective layer comprises a hydrophobic coating 61, so that the risk of water droplets present on the sensor surface and acting as a lens, may be reduced.

Figure 18:
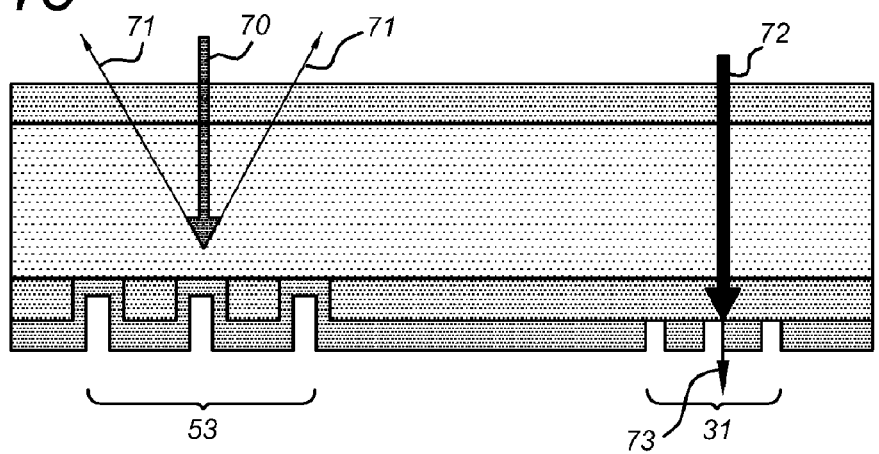
FIG. 18 shows schematically the reflection type and transmission type sensors of FIG. 12.

FIG. 18 further shows the principle of the measurements performed by the reflection image sensor and the transmission image sensor. Due to the the fact that the hydrophobic coating 61, the upper layer 63 and the lower layer 64 are essentially transmissive for the laser light (in some embodiments laser light of different wavelengths) impinging thereon, while the layer 58 is essentially opaque to the laser light, the marks 53 reflect the incoming laser light 70 and send the reflected laser light 71 to the reflection image sensors 51,52 arranged above the substrate table. Furthermore, the marks 31 allow some of the incoming laser light 72 to pass through the respective layers. The transmitted laser light 73 may then be picked up by the sensor 30 arranged in the substrate table.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the invention as described without departing from the scope of the claims set out below.

The invention claimed is:

1. A substrate stage of an immersion type lithographic apparatus arranged to project a patterned radiation beam from a patterning device onto a substrate, the substrate stage being constructed to hold the substrate and comprising:
   a sensor constructed and arranged to sense the patterned radiation beam, the sensor comprising:
      a transmissive layer, at least partially transmissive to a wavelength of the radiation beam and having a front side facing the incoming radiation beam and a back side opposite the front side, wherein the transmissive layer is positioned and dimensioned to receive substantially all of an aerial image of the projected patterned radiation beam in at least a depth direction;
      wherein the back side comprises a sensor mark positioned to receive at least a portion of the radiation beam transmitted through the front side of the layer.

2. A substrate stage according to claim 1, wherein the transmissive layer comprises a first transmissive layer and a second transmissive layer.

3. A substrate stage according to claim 1, wherein the sensor mark is arranged at least partially in a back side of the transmissive layer.

4. A substrate stage according to claim 1, wherein the back side of the transmissive layer is provided with a substantially non-transmissive layer.

5. A substrate stage according to claim 4, wherein the sensor mark is arranged at least partially in the non-transmissive layer.

6. A substrate stage according to claim 1, wherein the front side of the transmissive layer comprises a coating selected to repel an immersion liquid to be used in the lithographic apparatus.

7. A substrate stage according to claim 6 wherein the coating is a hydrophobic coating.

8. A substrate stage according to claim 6, wherein the coating has a refractive index between about 1.3 and 1.8, and a thickness between about 0.1 and 1.5 μm.

9. A substrate stage according to claim 1, wherein an index of refraction of the transmissive layer is substantially the same as an index of refraction of an immersion fluid to be used with the lithographic apparatus.

10. A substrate stage according to claim 1, wherein the transmissive layer is a transmissive plate and the mark comprises a grating.

11. A substrate stage according to claim 1, wherein the transmissive layer comprises a hydrophilic material.

12. A substrate stage according to claim 1, wherein the transmissive layer has a thickness between about 0.01 and 5 μm.

13. A substrate stage according to claim 12, wherein the transmissive layer has a thickness between 1 and 3 μm.

14. A substrate stage according to claim 1, wherein an index of refraction of the transmissive layer is between about 1.3 and 1.8.

15. A lithographic apparatus comprising:
   a projection system configured to project a patterned radiation beam from a patterning device onto a substrate:
   an immersion liquid system for providing an immersion liquid between the patterning device and the substrate;
   a substrate stage constructed to hold the substrate;
   a sensor, positioned in the substrate stage, and constructed and arranged to sense the patterned radiation beam, the sensor comprising:
      a transmissive layer, at least partially transmissive to a wavelength of the radiation beam and having a front side facing the incoming radiation beam and a back side opposite the front side wherein the transmissive layer is positioned and dimensioned to receive substantially all of an aerial image of the projected patterned radiation beam, and
      wherein the back side comprises a sensor mark positioned to receive at least a portion of the radiation beam transmitted through the front side of the layer.

* * * * *

UNITED STATES PATENT AND TRADEMARK OFFICE
CERTIFICATE OF CORRECTION

| | | |
|---|---|---|
| PATENT NO. | : 8,243,259 B2 | Page 1 of 1 |
| APPLICATION NO. | : 12/486458 | |
| DATED | : August 14, 2012 | |
| INVENTOR(S) | : Vitaliy Prosyentsov et al. | |

It is certified that error appears in the above-identified patent and that said Letters Patent is hereby corrected as shown below:

On title page, item (75) Inventors:
replace "Vitally"
with --Vitaliy--.

Signed and Sealed this
Sixth Day of November, 2012

David J. Kappos
*Director of the United States Patent and Trademark Office*